(12) United States Patent
Bonelli et al.

(10) Patent No.: US 12,231,115 B2
(45) Date of Patent: Feb. 18, 2025

(54) THRESHOLD DETECTOR OF A POWER ON RESET CIRCUIT WITH IMPROVED ACCURACY FOR SWITCHING LEVELS OVER TEMPERATURE VARIATIONS

(71) Applicant: ams International AG, Jona (CH)

(72) Inventors: Andrea Bonelli, Eindhoven (NL); Stefania Chicca, Eindhoven (NL)

(73) Assignee: ams International AG, Jona (CH)

( * ) Notice: Subject to any disclaimer, the term of this patent is extended or adjusted under 35 U.S.C. 154(b) by 0 days.

(21) Appl. No.: 17/429,798

(22) PCT Filed: Feb. 12, 2020

(86) PCT No.: PCT/EP2020/053601
§ 371 (c)(1),
(2) Date: Aug. 10, 2021

(87) PCT Pub. No.: WO2020/165250
PCT Pub. Date: Aug. 20, 2020

(65) Prior Publication Data
US 2022/0131538 A1 Apr. 28, 2022

Related U.S. Application Data

(60) Provisional application No. 62/856,982, filed on Jun. 4, 2019, provisional application No. 62/804,267, filed on Feb. 12, 2019.

(51) Int. Cl.
*H03K 17/22* (2006.01)
*H03K 17/14* (2006.01)
(52) U.S. Cl.
CPC ............. *H03K 17/22* (2013.01); *H03K 17/14* (2013.01)

(58) Field of Classification Search
CPC .............................. H03K 17/14; H03K 17/22
(Continued)

(56) References Cited

U.S. PATENT DOCUMENTS 6,400,212 B1 * 6/2002 Sakurai ................ G01R 19/165
327/539
6,437,614 B1 8/2002 Chen
(Continued)

FOREIGN PATENT DOCUMENTS

CN 107707232 A 2/2018
EP 0575687 A 12/1993
JP H08186484 A 7/1996

OTHER PUBLICATIONS

International Search Report and Written Opinion dated Apr. 30, 2020 for corresponding International Application No. PCT/EP2020/053601.
(Continued)

*Primary Examiner* — Ryan Johnson
*Assistant Examiner* — Colleen J O Toole
(74) *Attorney, Agent, or Firm* — VIERING, JENTSCHURA & PARTNER mbB

(57) ABSTRACT

A power on reset circuit includes a threshold detector circuit. The threshold detector circuit includes a power supply voltage, a voltage comparator, first circuitry, second circuitry, and third circuitry. The voltage comparator has first and second input terminals, and an output terminal to provide a reset signal. The first circuitry is operable to convert the power supply voltage to a sensed current, and provides a positive temperature coefficient to the sensed current. The second circuitry is operable to generate, based on the sensed current, a temperature-dependent voltage corresponding to the power supply voltage and to couple the temperature-dependent voltage to the first input of the voltage comparator. The third circuitry is operable to gen-
(Continued)

erate, based on the sensed current, a reference voltage and to couple the reference voltage to the second input of the voltage comparator.

12 Claims, 3 Drawing Sheets

(58) Field of Classification Search
 USPC .......................................... 327/142, 148, 198
 See application file for complete search history.

(56) References Cited

U.S. PATENT DOCUMENTS

| | | |
|---|---|---|
| 6,492,848 B1 | 12/2002 | Lee |
| 2002/0011882 A1 | 1/2002 | Ozeki |
| 2004/0189356 A1 | 9/2004 | Wada |
| 2007/0046341 A1* | 3/2007 | Tanzawa ................ H03K 17/14 327/143 |
| 2007/0146056 A1 | 6/2007 | McClure et al. |
| 2009/0219066 A1* | 9/2009 | Shkidt ................... H03K 17/22 327/143 |
| 2015/0042386 A1* | 2/2015 | Bhowmik ............ H03K 17/223 327/143 |
| 2018/0123583 A1 | 5/2018 | Singh et al. |

OTHER PUBLICATIONS

Chinese Office Action of corresponding Chinese patent application No. 202080041403.7, dated Feb. 1, 2024, 14 pages (for informational purposes only).

Guo Zongren et al., Programmable controller and its communication network technology, People's Posts and Telecommunications Publishing House, 1999, pp. 203-206.

Chinese office action issued for the corresponding Chinese patent application 202080014103.7, dated Aug. 31, 2024, 10 pages (for informational purposes only).

* cited by examiner

THRESHOLD DETECTOR OF A POWER ON RESET CIRCUIT WITH IMPROVED ACCURACY FOR SWITCHING LEVELS OVER TEMPERATURE VARIATIONS

RELATED APPLICATIONS

The present invention is a U.S. National Stage under 35 USC 371 patent application, claiming priority to Serial No. PCT/EP2020/053601, filed on 12 Feb. 2020; which claims priority from U.S. Provisional Application No. 62/804,267 filed 12 Feb. 2019; U.S. Provisional Application No. 62/856,982 filed 4 Jun. 2019, the entirety of each of which are incorporated herein by reference.

TECHNICAL FIELD

The disclosure relates to Power On Reset circuits.

BACKGROUND

A Power On Reset (POR) circuit is present in many electronic devices and more specifically on monolithic integrated circuits (ICs). The POR functions to initialize one or more components of a device to a known state when in the presence of a rising event of the power supply voltage of the device. It does so by asserting its output RESET signal when the supply voltage is below a certain threshold such that the components can be held in a reset state that is a known initial state. The output RESET signal should de-assert when the supply voltage rises above the level for a predictable and stable behavior near the normal operating voltage range of the device.

SUMMARY

The present disclosure describes POR circuits for selectively initializing one or more components of an electronic device (e.g., a monolithic integrated circuit) to a known state based on a measured power supply voltage of the device. Implementations of the described POR circuit can be used to provide high accuracy of the switching levels without the need for complex circuits such as bandgap voltage or current reference circuits, which tend to be greater in area and have higher quiescent current. As an example, this enables POR circuits to be implemented in a smaller area on a chip (e.g., compared to some other POR circuits).

In an aspect, the present disclosure describes a power on reset circuit that includes a threshold detector circuit. The threshold detector circuit includes a power supply voltage, a voltage comparator, first circuitry, second circuitry, and third circuitry. The voltage comparator has first and second input terminals, and an output terminal to provide a reset signal. The first circuitry is operable to convert the power supply voltage to a sensed current, and provides a positive temperature coefficient to the sensed current. The second circuitry is operable to generate, based on the sensed current, a temperature-dependent voltage corresponding to the power supply voltage and to couple the temperature-dependent voltage to the first input of the voltage comparator. The third circuitry is operable to generate, based on the sensed current, a reference voltage and to couple the reference voltage to the second input of the voltage comparator.

Implementations of this aspect can include one or more of the follow features.

Some implementations, the first circuitry includes a transistor having a base-emitter voltage that decreases with increasing temperature.

Some implementations, the first circuitry further includes a resistance network coupled to the transistor. The resistance network includes a resistive element in series with the transistor and a resistive element in parallel with the transistor.

Some implementations, the resistive element in series with the transistor includes a first resistive element and a second resistive element connected to one electrically at a node. The resistive element in parallel with the transistor is connected electrically to the node.

Some implementations, each of the second and third circuitries includes a respective transistor. A base-emitter voltage of the transistor in the second circuitry is more sensitive to temperature than is a base-emitter voltage of the transistor in the third circuitry.

Some implementations, the transistor in the second circuitry has a larger emitter area than the transistor in the third circuitry.

Some implementations, an aspect ratio of the transistor in the second circuitry is greater than an aspect ratio of the transistor in the third circuitry.

Some implementations, a ratio of the aspect ratio of the transistor in the second circuitry to the aspect ratio of the transistor in the third circuitry is 10.

Some implementations, the voltage comparator is operable to provide, as the reset signal, a first signal having a first voltage value when the temperature-dependent voltage coupled to the first input of the voltage comparator is greater than the reference voltage coupled to the second input of the voltage comparator. Further, the voltage comparator is operable to provide, as the reset signal, a second signal having a second voltage value when the temperature-dependent voltage coupled to the first input of the voltage comparator is less than the reference voltage coupled to the second input of the voltage comparator. The first voltage value is less than the second voltage value.

Some implementations, the first voltage value corresponds to a digital 0, and the second voltage value corresponds to a digital 1.

Some implementations, the power on reset circuit includes a pulse width generator. The pulse width generator is operable to receive the reset signal and generate a control signal for initializing one or more components of an electronic device based on the reset signal.

Some implementations, the electronic device is a monolithic integrated circuit.

Some implementations, the monolithic integrated circuit is part of the monolithic integrated circuit.

The details of one or more implementations are set forth in the accompanying drawings and the description below. Other features and advantages will be apparent from the description and drawings, and from the claims.

DETAILED DESCRIPTION

In general, a POR circuit is partitioned into two functional stages: a threshold detector and a pulse width generator. The threshold detector is operable to detect when the supply voltage is above or below a certain supply voltage level for the device to operate and in response, generate a reset signal to trigger the operation of the pulse width generator. The pulse width generator is operable, when triggered, to generate a control signal for initiating one or more components of the electronic device (e.g., a control signal having a pulse with a duration that is long enough to cause the components coupled to the POR circuit to initialize). The present description focuses on the threshold detector circuit.

Figure 1:
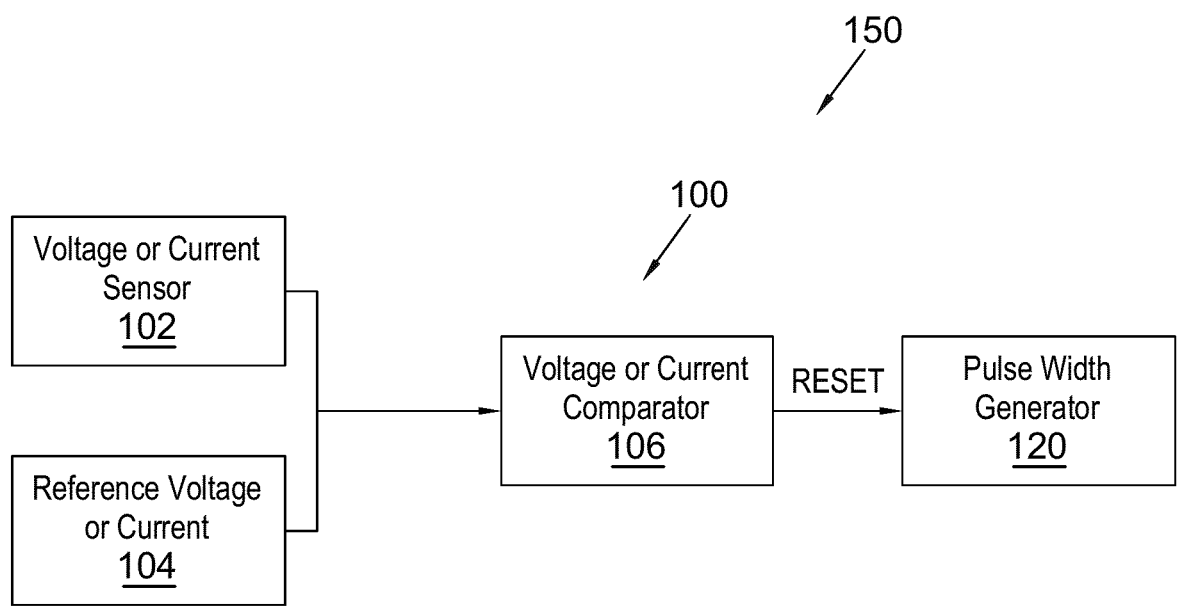
FIG. 1 is a functional block diagram of an example threshold detector of a POR circuit.

FIG. 1 is a functional block diagram of an example threshold detector 100 of a POR circuit 150. The threshold detector 100 includes a supply voltage sensor 102, a reference voltage or current 104, and a voltage or current comparator 106.

In an example operation of the threshold detector 100, the supply voltage 102 measures a power supply voltage (e.g., the voltage of an electrical signal providing power to an electronic device, such as a monolithic integrated circuit), and provides an indication of the measured voltage to the voltage or current comparator 106. The voltage or current comparator 106 compares the measured voltage to the reference voltage or current 104, and selectively generates a RESET signal based on a comparison. The RESET signal is provided to a pulse width generator 150, which generates a control signal to initialize one or more components of the electronic device components to a known state (e.g., to "reset" the components to a known state due to changes in the supply voltage, such as when the supply voltage is above or below a certain supply voltage required for the device to operate properly).

An important function of the POR circuit is to reset the components (e.g., generate a RESET signal to control the operation of the pulse width generator 120) in the presence of a falling event of the device's voltage supply to disable some or all functionality of the device when the voltage is too low for predictable behavior. In some cases, the switching levels for rising and falling supply voltages do not overlap, but the rising switching levels can be higher than the falling switching levels. For example, the POR can generate a RESET signal when the supply voltage exceeds a threshold voltage $V_{threshold,high}$, and generate a RESET signal when the supply voltage decreases below a threshold voltage $V_{threshold,low}$, where $V_{threshold,high}$ is greater than $V_{threshold,low}$.

The operation of a POR circuit is constrained by area and quiescent current. As this circuit generally operates only during power up and power down, the physical area (e.g., the area of a chip) that can be dedicated to this functionality is relatively small compared to the area allotted for implementing other functionality of the device. Further, in embodiments where ICs are operating from a battery, it is important that the quiescent current be of the same order of magnitude as the total leakage current of a device, for example less than 1 μA.

A problem to address when designing POR circuit for monolithic IC is the variation of the switching levels in presence of process and temperature variations. In many implementations, these circuits show high inaccuracy due to the drift of various device parameters such as the threshold voltage $V_{th}$ of metal-oxide-semiconductor (MOS) transistors, the base-emitter voltage $V_{be}$ of bipolar transistors, and the parameter β and the output resistance of MOS transistors. This inaccuracy is particularly important when operating at a low voltage supply (e.g., 1.8 V or below). In the presence of a high spread of the switching level, the POR circuit may de-assert either at a supply voltage that is too low when the reset of the circuit cannot be guaranteed or when the switching level is too high (e.g., above the minimum operating voltage of the device) with the consequence that the device does not power up.

One approach to reducing the spread of the switching levels is to design POR circuits with switching levels that are a function of the ratio of device parameters so as to avoid dependency on the absolute accuracy of device parameters. This is because, in IC process technology, it is relatively easy to obtain an accurate ratio between parameters of the same type of devices, but it is relatively difficult to design for absolute values.

Figure 2:
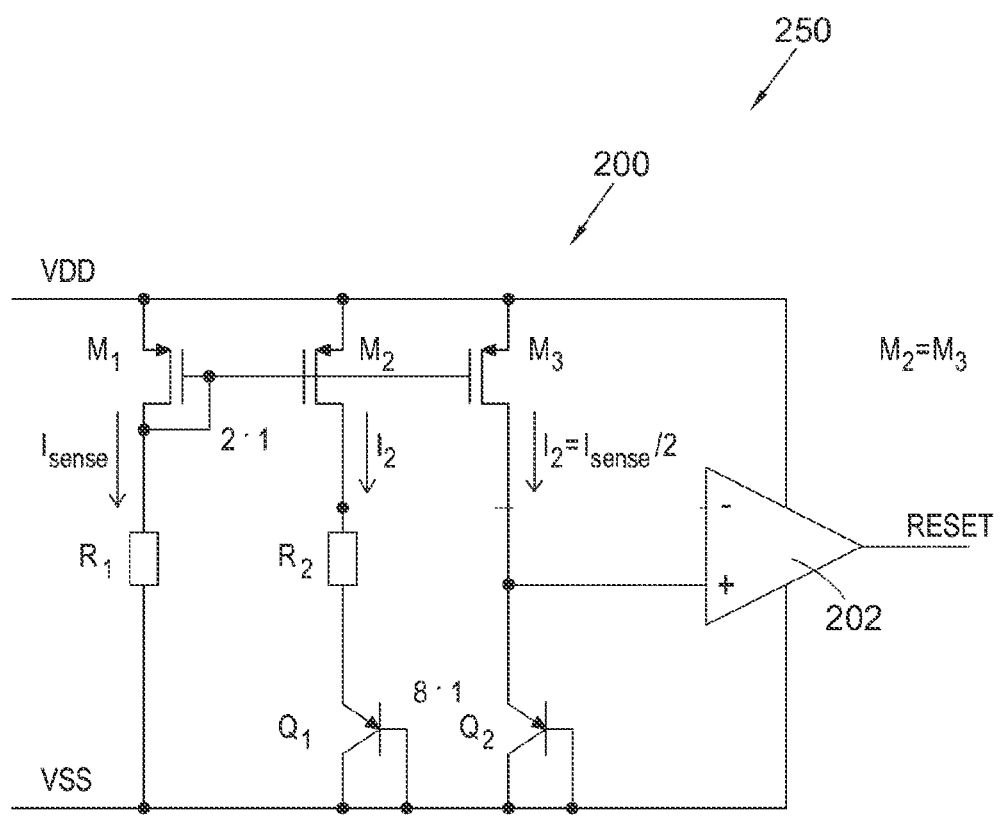
FIG. 2 is a diagram of an example threshold detector of a POR circuit.

FIG. 2 shows an example of a threshold detector 200 of a POR circuit 250 in which a voltage comparator 202 (e.g., an operational amplifier) is used to generate a RESET signal to trigger a pulse width generator (not shown in FIG. 2) to generate a control signal for initiating one or more components of the electronic device. When the voltage at the "−" terminal of the voltage comparator 202 is greater than the voltage at the "+" terminal of the voltage comparator 202, the power supply voltage VDD is sufficiently high for the device to operate, the RESET signal is thus low (e.g., a digital 0), and the device is able to operate. Conversely, when the voltage at the "−" terminal of the voltage comparator 202 is less than the voltage at the "+" terminal of the voltage comparator 202, the power supply voltage VDD is insufficiently high for the device to operate, the RESET signal is high (e.g., a digital 1), and the other device functions controlled by the POR circuit 250 are disabled (e.g., via a control signal generated by a pulse width generator).

In the illustrated POR circuit 250, a bipolar transistor $Q_2$ is biased from transistor M3 to generate a relatively stable voltage reference $V_{be,2}$. A resistance $R_1$, a current mirror formed of transistors $M_1$ and $M_2$, a second resistance $R_2$ and a second bipolar transistor $Q_1$ are provided to generate a voltage proportional to the power supply voltage VDD. The ratio of $W_1$ and $W_2$ of the transistors $M_1$ and $M_2$, respectively, in the illustrated example is 2:1 ($W_1=2*W_2$), and the transistors $M_2$ and $M_3$ are substantially the same as one another, where $W_N$ is channel width and $L_N$ is channel length of a MOS transistor $M_N$.

A voltage comparator 202 is operable to generate an output signal (RESET) indicative of the relative values of the reference voltage (at the "+" terminal) and the sensed voltage (at the "−" terminal). The RESET signal is indicative of whether the power supply voltage VDD is sufficiently high for operation of some other device. The switching level depends on the area ratio between $Q_1$ and $Q_2$, where the area of $Q_1$ is N times (e.g., 8) larger than the area of $Q_2$. $Q_1$ can be implemented, for example, as N parallel transistors substantially the same as the transistor $Q_2$. The ratio of $R_1$ and $R_2$ provides a relatively accurate switching level.

In operation, the power supply voltage VDD is sensed and converted to a corresponding current ($I_{sense}$) in a first branch of the circuit that includes $M_1$ and $R_1$. The sensed current is scaled (e.g., by a factor of 0.5) and mirrored, and flows substantially equally in the second and third branches of the circuit (one branch includes $M_2$, $R_2$ and $Q_1$; the other branch includes $M_3$ and $Q_2$). Thus, in the illustrated example, a current $I_{sense}/2$ flows in each of the second and third branches of the circuit.

Because of the logarithmic dependency of $V_{be}$ in respect to it bias current, $Q_2$ has a base-emitter voltage $V_{be}$ that remains relatively constant. Thus, a voltage in the third branch that is coupled to an input of the voltage comparator 202 serves as a reference voltage.

As the voltage VDD increases, the current $I_{sense}$ increases substantially linearly, and thus the voltage across $R_2$ also increases substantially linearly. A voltage in the second branch corresponds to the sensed voltage and is coupled to an input of the voltage comparator 202.

The switching level of the POR circuit 250 in FIG. 2 is reached when the voltage at the inputs of the voltage comparator 202 are equal, and can be given by the following equation:

$$V_{SWITCH} = 2\frac{R_1}{R_2}V_T \ln(8) + V_{GS1} \quad \text{(eq. 1)}$$

where $V_T$ is KT/q, and is ~26 mV at 300 K.

The term $V_{GS1}$ is relatively small and so can be neglected here. Notably, the switching level depends on the ratio of devices ($R_1/R_2$ and $Q_1/Q_2$) rather then absolute value of device parameters. Further, the switching levels have a positive temperature coefficient from the $V_T$ factor.

Because the switching level depends on the ratio of devices ($R_1/R_2$ and $Q_1/Q_2$), a potential problem arises for devices operating at low supply voltages because the temperature coefficient can be about 2.5 m V/° C., causing high variation in $V_{SWITCH}$, especially if the operating temperature range is wide.

The effects of this temperature drift can be compensated for by precisely controlling the temperature coefficient of the supply sensing current. As an example, FIG. 3 shows a modified circuit 300 that compensates for the temperature drift of the switching levels of the type of POR circuit of FIG. 2 and preserves the setting of the switching levels from device parameters ratio rather than absolute accuracy.

Figure 3:
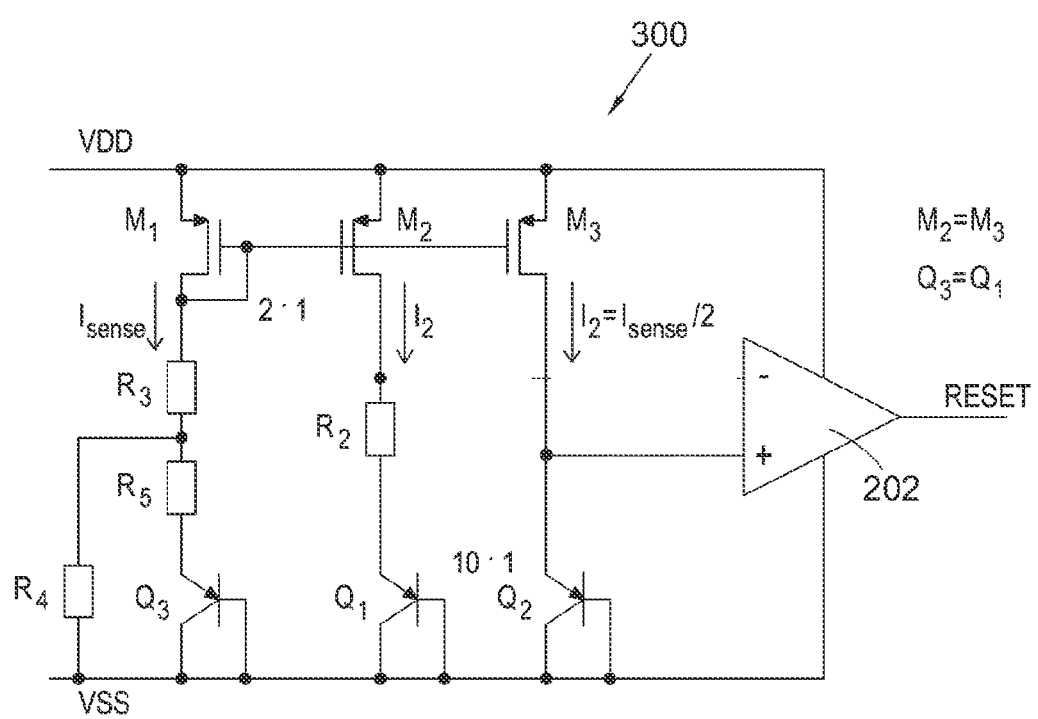
FIG. 3 is a diagram of another example threshold detector of a POR circuit.

As shown in FIG. 3, the modified circuit 300 resolves the drift over temperature by adding a positive temperature coefficient to the sensed current $I_{sense}$. In the circuit 300 of FIG. 3, the resistance $R_1$ of FIG. 2 is replaced with a network of resistances $R_3$, $R_4$, $R_5$ and a transistor $Q_3$. In some embodiments, the resistance $R_5$ may be the base resistance in parallel with the 1/gm of the bipolar transistor $Q_3$.

The circuit 300 of FIG. 3 is operable to generate a sense current $I_{sense}$ that increases with increasing temperature. In particular, $Q_3$ has a base-emitter voltage ($V_{be}$) that decreases with increasing temperature (e.g., by approximately 2.5 mV/° C.), which pulls down the voltage at the node connecting $R_3$, $R_4$, and $R_5$. This, in turn, increases the voltage across $R_3$, resulting in a higher sense current $I_{sense}$.

Also, as temperature increases, the current flowing through $R_2$ increases. Since $Q_1$ has a larger (emitter) area than $Q_2$, $Q_1$ is more sensitive to changes in temperature. In particular, ($V_{be,Q1} - V_{be,Q2}$) has a negative temperature coefficient. Adding a positive temperature coefficient to the sensed current $I_{sense}$ thus can help compensate for temperature drift.

The switching level of the circuit in FIG. 3 can be approximated by the following equation:

$$V_{SWITCH} = \frac{2}{R_2}V_T\ln(NQ)\frac{R3(R4+R5)+R4 \cdot R5}{R4+R5} + V_{be,Q3}\frac{R4}{R4+R5} + V_{GS1} \quad \text{(eq. 2)}$$

where NQ is the aspect ratio between $Q_1$ and $Q_2$ (e.g., 10 in the example embodiment shown in FIG. 3).

In this equation, $V_T$ and $V_{be,Q3}$ have opposite temperature coefficients (e.g., $V_T$ increases with increasing temperature, whereas $V_{be,Q3}$ decreases with increasing temperature). Therefore, with proper sizing of $R_3$, $R_4$ and $R_5$, it is possible to keep the switching levels approximately constant over the temperature range. For example, values for the various components can be selected such that the changes caused by $V_T$ and $V_{be,Q3}$ tend to cancel out one another over the temperature range of interest.

The circuit 300 of FIG. 3 thus can compensate for the effect of temperature variations by the insertion of a precise temperature dependency for the supply sensing current. In particular, the circuit 300 of FIG. 3 provides a first order correction of the temperature drift of the switching levels. This feature thus can provide high accuracy of the switching levels without the need for complex circuits such as bandgap voltage or current reference circuits, which tend to be greater in area and have higher quiescent current. As an example, computer simulations indicate that the circuit 300 can provide a reduction of 4440 µm² (e.g., a reduction of 30.4%) compared to some other circuits.

The techniques described here can be used in a wide range of monolithic ICs.

Although the example circuit 300 of FIG. 3 employs PNP bipolar transistors (e.g., transistors having a layer of N-doped semiconductor positioned between two P-doped layers), NPN transistors (e.g., transistors having a layer of P-doped semiconductor positioned between two N-doped layers) can be used in some implementations. Further, the specific relative sizes of the various transistors (e.g., $Q_1$ and $Q_2$; $M_1$ and $M_2$, $M_3$) can vary from the examples describes above.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of embodiments have been described. Nevertheless, various modifications may be made without departing from the spirit and scope of the invention. Accordingly, other implementations are within the scope of the claims.

What is claimed is:

1. A power on reset circuit comprising:
   a threshold detector circuit including:
      a terminal configured to sense a power supply voltage to an electrical device;
      a voltage comparator having first and second input terminals, the voltage comparator further having an output terminal to provide a reset signal;
      first circuitry operable to convert the power supply voltage to a sensed current, wherein the first circuitry provides a positive temperature coefficient to the sensed current;
      second circuitry operable to generate, based on the sensed current, a temperature-dependent voltage corresponding to the power supply voltage and to couple the temperature-dependent voltage to the first input of the voltage comparator; and
      third circuitry operable to generate, based on the sensed current, a reference voltage and to couple the reference voltage to the second input of the voltage comparator, wherein the first circuitry forms a current mirror with the second circuity and with the third circuitry;

further comprising a pulse width generator, wherein the pulse width generator is operable to receive the reset signal and generate a control signal for initializing one or more components of an electronic device based on the reset signal.

2. The power on reset circuit of claim 1, wherein the first circuitry includes a transistor having a base-emitter voltage that decreases with increasing temperature.

3. The power on reset circuit of claim 2, wherein the first circuitry further includes a resistance network coupled to the transistor, wherein the resistance network includes a resistive element in series with the transistor and a resistive element in parallel with the transistor.

4. The power on reset circuit of claim 3, wherein the resistive element in series with the transistor includes a first resistive element and a second resistive element connected to one electrically at a node, and wherein the resistive element in parallel with the transistor is connected electrically to the node.

5. The power on reset circuit of claim 1, wherein each of the second and third circuitries includes a respective transistor, wherein a base-emitter voltage of the transistor in the second circuitry is more sensitive to temperature than is a base-emitter voltage of the transistor in the third circuitry.

6. The power on reset circuit of claim 5 wherein the transistor in the second circuitry has a larger emitter area than the transistor in the third circuitry.

7. The power on reset circuit of claim 5, wherein an aspect ratio of the transistor in the second circuitry is greater than an aspect ratio of the transistor in the third circuitry.

8. The power on reset circuit of claim 7, where a ratio of the aspect ratio of the transistor in the second circuitry to the aspect ratio of the transistor in the third circuitry is 10.

9. The power on reset circuit of claim 1, wherein the voltage comparator is operable to:

provide, as the reset signal, a first signal having a first voltage value when the temperature-dependent voltage coupled to the first input of the voltage comparator is greater than the reference voltage coupled to the second input of the voltage comparator, and provide, as the reset signal, a second signal having a second voltage value when the temperature-dependent voltage coupled to the first input of the voltage comparator is less than the reference voltage coupled to the second input of the voltage comparator, wherein the first voltage value is less than the second voltage value.

10. The power on reset circuit of claim 9, wherein the first voltage value corresponds to a digital 0, and wherein the second voltage value corresponds to a digital 1.

11. The power on reset circuit of claim 1, wherein the electronic device is a monolithic integrated circuit.

12. The power on reset circuit of claim 11, wherein the power on reset circuit is part of the monolithic integrated circuit.

* * * * *